(12) United States Patent
Gorghuber

(10) Patent No.: US 10,908,228 B1
(45) Date of Patent: Feb. 2, 2021

(54) BROKEN BOOM TIP BONDING DETECTION

(71) Applicant: Altec Industries, Inc., Birmingham, AL (US)

(72) Inventor: Steven J. Gorghuber, Duluth, MN (US)

(73) Assignee: Altec Industries, Inc., Birmingham, AL (US)

( * ) Notice: Subject to any disclaimer, the term of this patent is extended or adjusted under 35 U.S.C. 154(b) by 0 days.

(21) Appl. No.: 16/695,660

(22) Filed: Nov. 26, 2019

(51) Int. Cl.
G01R 31/54 (2020.01)
G08C 19/00 (2006.01)
H04B 3/46 (2015.01)

(52) U.S. Cl.
CPC ............ G01R 31/54 (2020.01); G08C 19/00 (2013.01); H04B 3/46 (2013.01)

(58) Field of Classification Search
CPC ........... G01R 31/54; G08C 19/00; H04B 3/46
See application file for complete search history.

(56) References Cited

U.S. PATENT DOCUMENTS

| | | | | |
|---|---|---|---|---|
| 3,136,385 A * | 6/1964 | Eitel | ...................... | B66F 11/046 182/2.4 |
| 3,769,578 A * | 10/1973 | Staley | .................. | G01R 27/025 324/557 |
| 4,099,074 A * | 7/1978 | Maeda | ................... | G04G 21/08 307/116 |
| 4,153,850 A * | 5/1979 | Boyer | ..................... | F02P 7/067 123/614 |
| 4,403,104 A * | 9/1983 | Dale | ...................... | H02G 15/06 174/142 |
| 4,477,289 A * | 10/1984 | Kurtgis | ..................... | H02G 1/02 134/34 |
| 4,553,632 A * | 11/1985 | Griffiths | ................ | B66F 11/044 182/19 |
| 4,762,199 A * | 8/1988 | Holmes | .................. | B66F 11/044 182/148 |
| 4,833,415 A * | 5/1989 | Nourai | ................ | G01R 31/1245 324/557 |
| 5,231,309 A * | 7/1993 | Soma | ...................... | G03G 15/80 307/125 |
| 5,296,844 A * | 3/1994 | Hanrahan | ............ | G01R 19/155 182/230 |
| 5,576,695 A * | 11/1996 | Minger | .................. | G01R 31/50 340/649 |
| 5,905,408 A * | 5/1999 | Huijser | ................. | H03F 3/3081 330/51 |
| 2012/0217091 A1* | 8/2012 | Baillargeon | ............ | B66F 11/04 182/18 |
| 2016/0358446 A1* | 12/2016 | Ishii | ..................... | G08B 25/016 |
| 2018/0313885 A1* | 11/2018 | Bilic | ........................ | H03K 5/24 |
| 2019/0135603 A1* | 5/2019 | Bilic | ..................... | B66F 17/006 |

* cited by examiner

*Primary Examiner* — Rufus C Point
(74) *Attorney, Agent, or Firm* — Erise IP, P.A.

(57) ABSTRACT

A device for detecting the condition of electrical bonding of a plurality of conductive components of an aerial device, the aerial device comprising a plurality of electrical bonding cables, a control module, a gradient control device, a feedback wire to carry an input signal from the conductive components to the control module, and a power source. The device uses the input signal to determine the condition of the electrical bonding of the conductive components including the condition of the electrical bonding cables and connections therebetween and is configured to notify an operator if an unacceptable condition is determined based on a predetermined acceptance standard.

20 Claims, 7 Drawing Sheets

BROKEN BOOM TIP BONDING DETECTION

BACKGROUND

1. Field

Embodiments of the invention relate to monitoring operation characteristics of an aerial device of a utility vehicle. More specifically, embodiments of the invention relate to monitoring the condition of electrical bonding cables attached to conductive components of an aerial device.

2. Related Art

Utility workers utilize vehicles having aerial devices with boom assemblies. In certain cases, insulating aerial devices with insulating properties are used while performing operations on an energized power line. The insulating aerial device may have conductive components located at a distal end of the insulating boom assembly that may be connected via electrical bonding cables to a gradient control device and electrically bonded to the energized power line. The operator is also electrically bonded to the energized power line. If the conductive components or the electrical bonding cables become damaged or broken, the insulating aerial device may not be able to properly maintain the insulating properties.

Currently, operators are instructed to manually perform a continuity test of the electrical bonding cables using a digital multi-meter before bonding the insulating aerial device to energized power lines. The manual test can be a time-consuming process for the operators, and in certain cases may be skipped according to various human factors. In some cases, operators perform a "soak" test, in which they bond a platform of the insulating aerial device to an energized power line without any personnel on the platform. The soak test may be performed at the beginning of each day and targets the entire bonding, insulating, and leakage monitoring system. Benefits of the "soak" test include limiting operator exposure to the hazard of broken electrical bonding cables. However, property damage can still occur during the test. Accordingly, an automatic alternative for monitoring conductive components and electrical bonding cables is needed.

SUMMARY

Embodiments of the invention solve the above-mentioned problems by providing a system for automatically monitoring the electrical bonding condition of conductive components at the distal end of a boom assembly of an insulating aerial device. In some embodiments, the system comprises a plurality of electrical bonding cables electrically connecting the plurality of conductive components to a gradient control device, an electronic control module including at least one microprocessor and a memory having a non-transitory computer-readable storage medium, an input of the electronic control module for receiving a signal, a power source, and a feedback wire between the conductive components and the input of the electronic control module. The non-transitory computer-readable storage medium stores a computer program, that when executed by the at least one microprocessor of the electronic control module, monitors the voltage on the feedback wire, and based on the monitored voltage, determines a bonding state of the conductive components and the electrical bonding cables. The system may also include a notification device to signal the operator if an issue is detected.

A first embodiment of the invention is directed to a system for monitoring the condition of a plurality of conductive components of an insulating aerial device. In the first embodiment, the conductive components are electrically connected by electrical bonding cables in a series configuration with a single feedback wire relaying at least one signal to the electronic control module. The at least one signal is indicative of the collective resistance of the plurality of conductive components. An electronic control module uses the at least one signal to determine whether the plurality of conductive components is in an acceptable condition and uses a notification device to notify an operator of the condition.

A second embodiment of the invention is directed to a system for monitoring the condition of a plurality of electrical bonding cables at a distal end of a boom assembly of an insulating aerial device. In the second embodiment, the conductive components are electrically connected by the electrical bonding cables in a parallel configuration with a plurality of respective feedback wires. Each of the plurality of feedback wires relays at least one signal to an electronic control module from a respective one of the plurality of electrical bonding cables. Each at least one signal is indicative of the individual resistance of the respective electrical bonding cable. The electronic control module uses the at least one signal to determine whether the plurality of electrical bonding cables is in an acceptable condition based on a predetermined acceptance standard and uses a notification device to notify an operator of the condition of each of the plurality of electrical bonding cables.

A third embodiment of the invention is directed to a non-transitory computer-readable storage medium for monitoring the condition of a plurality of electrical bonding cables at a distal end of a boom assembly of an aerial device, wherein the computer-readable storage medium instructs an electronic control module to perform the steps of: receiving, from a feedback wire, at least one signal associated with a resistance that is indicative of the condition of at least one of the plurality of electrical bonding cables; determining, based at least in part on the at least one signal associated with the resistance, whether the condition of the plurality of electrical bonding cables is acceptable or unacceptable based on the predetermined acceptance standard; and sending, to an operator, a notification notifying the operator of the condition of the plurality of electrical bonding cables via a notification device.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the invention will be apparent from the following detailed description of the embodiments and the accompanying drawing figures.

BRIEF DESCRIPTION OF THE DRAWING FIGURES

Embodiments of the invention are described in detail below with reference to the attached drawing figures, wherein.

Figure 1:
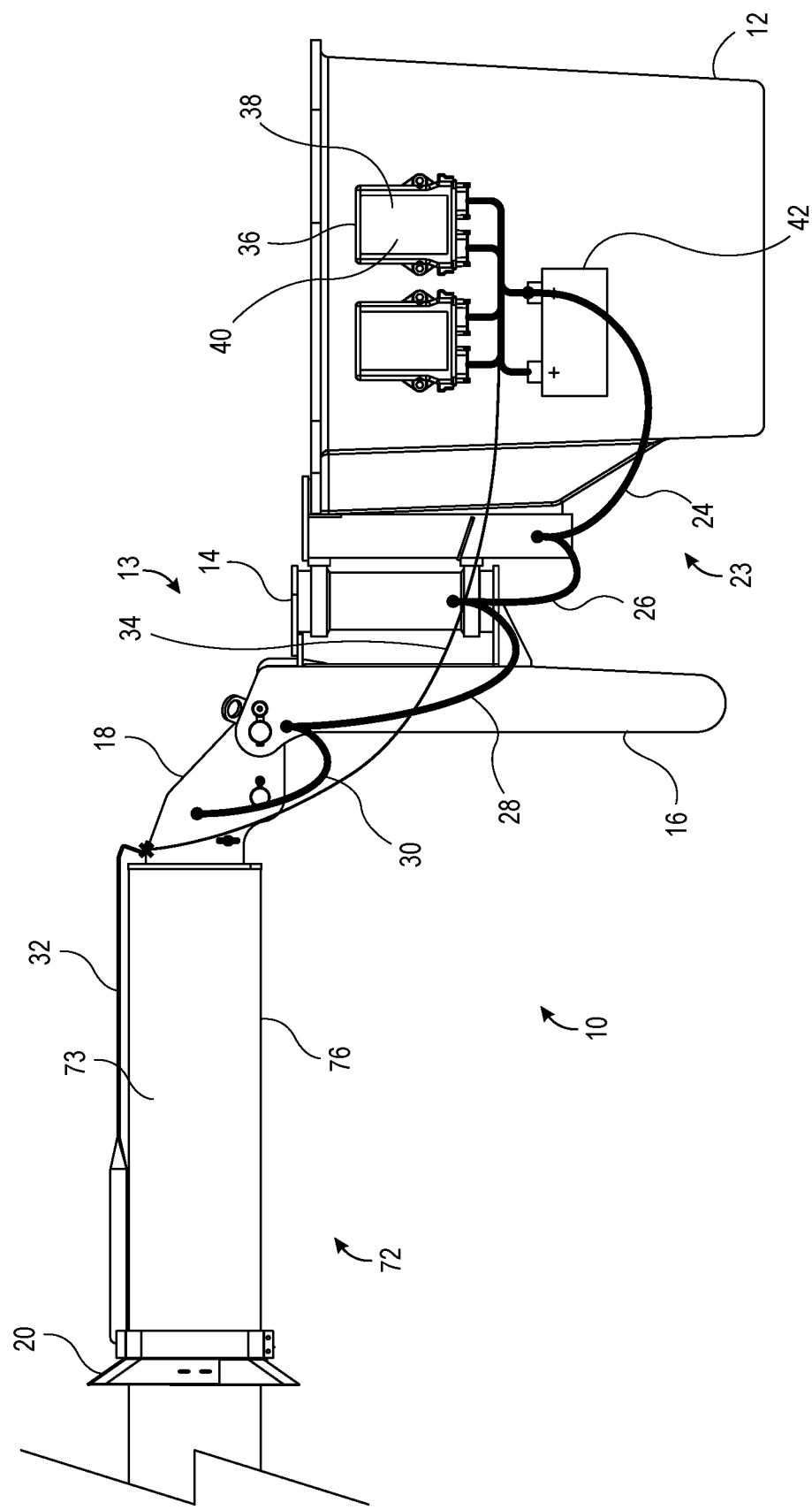
FIG. 1 is a schematic of a boom assembly with an insulating aerial device relating to an exemplary embodiment of the invention.

The drawing figures do not limit the invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the invention. The following detailed description is, therefore, not to be taken in a limiting sense. The scope of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments but is not necessarily included. Thus, the technology can include a variety of combinations and/or integrations of the embodiments described herein.

In some embodiments, the system is integrated into an insulating aerial device having an insulating boom assembly and a platform. The insulating boom assembly of the insulating aerial device may be used to position maintenance personnel while performing maintenance operations on an energized power line. During the maintenance operations, the platform, the operator, and the conductive components of the insulating aerial device may be electrically bonded to the energized power line and electrically connected by electrical bonding cables to a gradient control device, which may be a corona ring. The platform, the operator, and the conductive components may be insulated from earth ground by the insulating boom assembly. During such maintenance operations, the insulating aerial device may be used in close proximity to the energized powerline. The connections ensure proper dielectric performance of the gradient control device and equal electric potential between the energized power line, the operator, the platform, and the conductive components. An equal electric potential among the power line, the operator, the platform, and the conductive components is desirable, as it diminishes an electric shock hazard posed by the operator contacting a conductive component at a different electric potential.

In some embodiments, the conductive components may be metal components capable of conducting an electrical current, such as, for example, a steel boom tip, a steel leveling bracket, a steel platform rotator, or a platform of the insulating aerial device. The electrical bonding cables may be insulated, formed out of braided metal material, and attached to the conductive components via welding, nuts, cable-ties, clamps, or some other means of fastening. In some embodiments, electrical bonding cables are used to electrically bond the conductive components to the energized power line by attaching the cables to the energized power line via nuts, cable-ties, clamps, or some other means of fastening. By electrically bonding the conductive components to the energized power line, the platform, the operator, the conductive components, and the energized power line may be held at a similar electric potential.

The electrical bonding described herein refers to the electrical connecting of electrical components to maintain the electrical components at a common voltage potential. An increased resistance in the electrical bonding cables will inhibit the electrical bonding capabilities of the electrical bonding cables, which may lead to undesirable varying voltage potentials across the electrical components and improper performance of the gradient control device (which is another potential source of an electronic shock hazard). The electrical components herein may refer to conductive components of the aerial device, electrical bonding cables, the corona ring, the energized power line, or connections therebetween. In some embodiments, other electrical components may be present.

Figure 5:
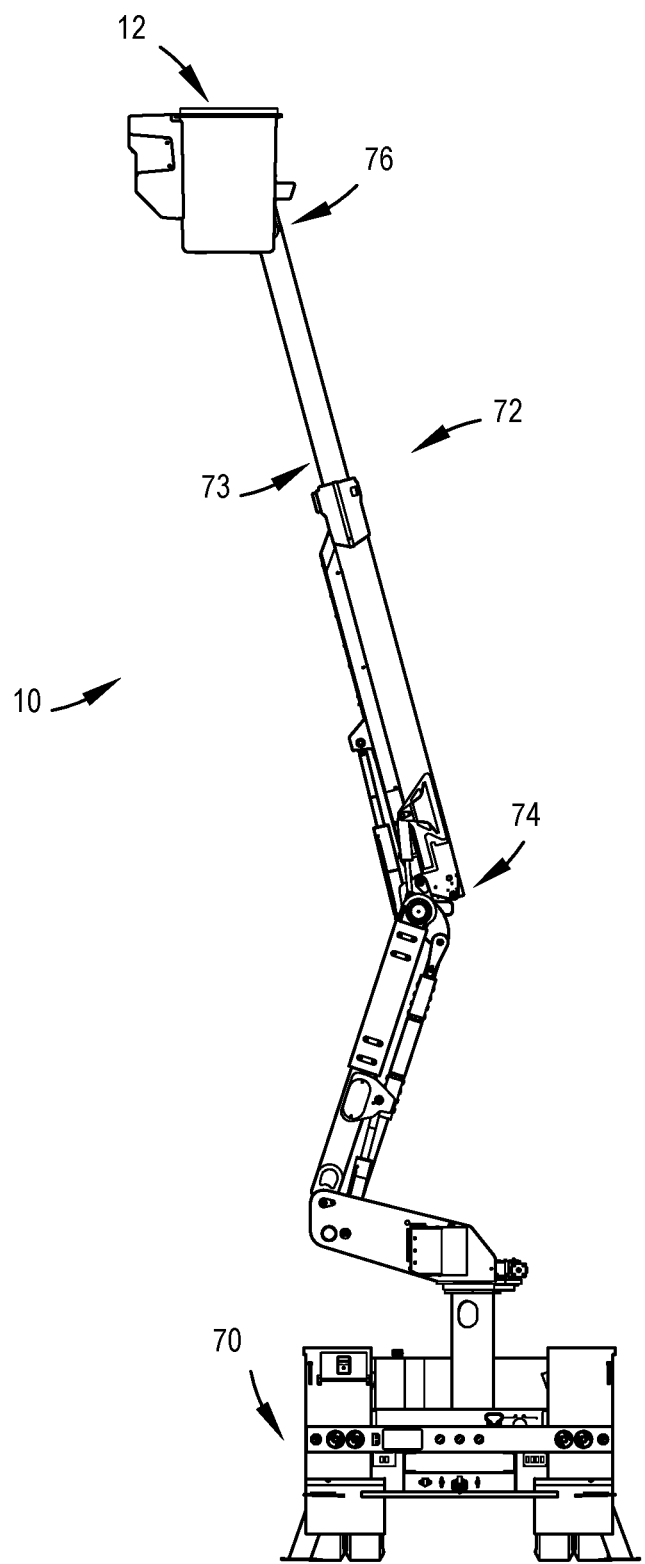
FIG. 5 is a general utility boom assembly with an aerial device relating to some embodiments of the invention.

FIG. 1 shows an exemplary embodiment of the invention, where an electrical bonding detection system is integrated into an insulating aerial device 10 (hereinafter aerial device 10) attached to a utility vehicle 70, as shown in FIG. 5. In some embodiments, the aerial device 10 may be electrically insulating for use in close proximity to an energized power line. The aerial device 10 comprises a platform 12, an attachment assembly 13, and a boom assembly 72. The boom assembly 72 may be an insulating boom assembly. The platform 12 may be attached to the attachment assembly 13. The attachment assembly 13 comprises a platform rotator 14 and a leveling bracket 16. The platform 12 may be attached to the attachment assembly 13 via attachment of the platform 12 to platform rotator 14, which may be pivotally attached to leveling bracket 16. The boom assembly 72 comprises a boom 73 having a distal end 76 that includes a boom tip 18. The platform 12, platform rotator 14, leveling bracket 16, and boom tip 18 may be conductive components. The boom assembly 72 may further comprise a corona ring 20, positioned at the distal end 76 of the boom assembly 72, to maintain the insulating properties of the boom assembly. The conductive components may be electrically connected in series via a plurality of electrical bonding cables 23. In some embodiments, the electrical bonding cables 23 comprise: a first electrical bonding cable 24 connected to negative terminal of a power source 42 and attached to platform 12; a second electrical bonding cable 26 attached to platform 12 and platform rotator 14; a third electrical bonding cable 28 attached to platform rotator 14 and leveling bracket 16; a fourth electrical bonding cable 30 attached to leveling bracket 16 and boom tip 18; and a fifth electrical bonding cable 32 attached to boom tip 18 and to corona ring 20. A feedback wire 34 may be connected to corona ring 20 and carry a voltage signal to electronic control module 36, which comprises a pull-up resistor 38 and a microprocessor 40. The electronic control module 36 may also be wired to power source 42 at both the positive and negative terminals, thereby completing an electrical circuit.

Figure 2:
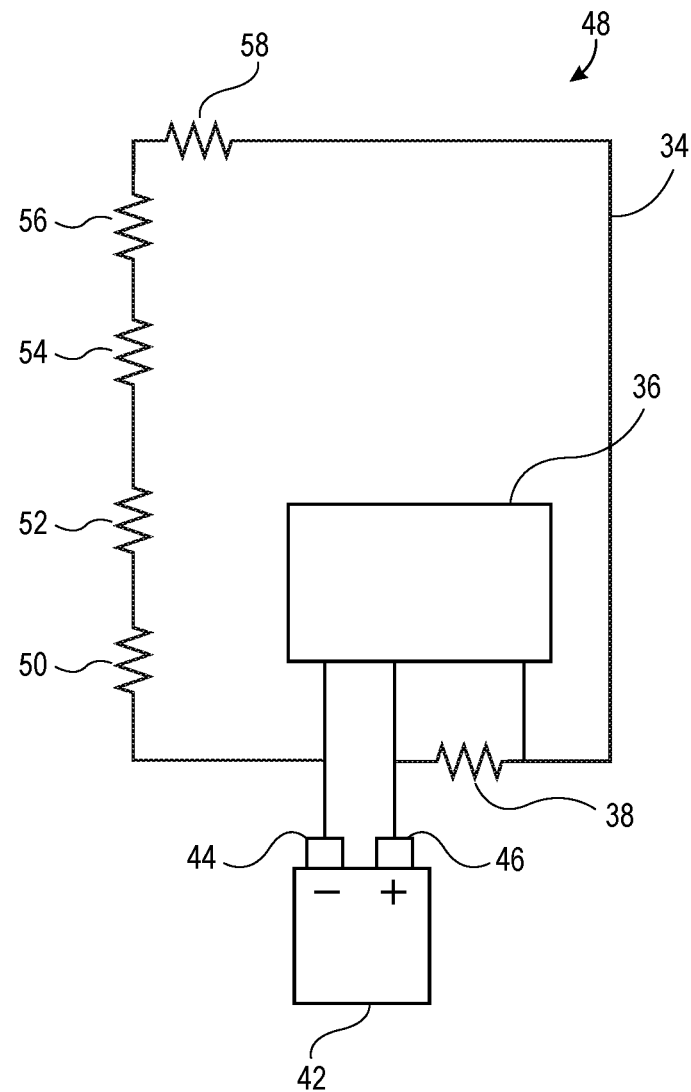
FIG. 2 is a circuit diagram relating to an exemplary embodiment of the invention.

FIG. 1 will now be described in operation. During operation of the aerial device 10, a voltage and current are supplied by the power source 42, to the series of electrical bonding cables 23 and to the electronic control module 36. The current travels through each of the series of electrical bonding cables 23 into corona ring 20 and then by feedback wire 34 into the electronic control module 36. If any of the cables are damaged or broken, they produce an elevated resistance, which causes a voltage drop in the current passing through the cables. The current supplied via the feedback wire 34 to electronic control module 36 may be input parallel to pull-up resistor 38, as shown in FIG. 2. The microprocessor 40 measures the input voltage given as an analog input relative to the power source 42. The microprocessor 40 then determines whether the voltage is associated with an increased resistance that is indicative of a defect in at least one of the plurality of electrical bonding cables 23 by comparing the input voltage with a voltage of the predetermined acceptance standard.

Damaged or broken electrical bonding cables 23 on an aerial device 10 may present a hazard to the aerial device 10. Damage present in the conductive components, electrical bonding cables 23, or connections therebetween may be associated with deterioration or terminal corrosion or other failure modes, and the damage may cause the conductive components to hold different electrical potentials. Without reliable connectivity of the cables to the conductive components, the gradient control device may not operate effectively.

The electrical bonding cables 23 are connected to the gradient control device, which may be corona ring 20, to prevent the formation of a corona discharge resulting from electrical gradients. A corona discharge is known as the ionization of air around electrical components. If any of the plurality of electrical bonding cables 23, or the connections of the plurality of electrical bonding cables 23 to the conductive components becomes broken or damaged, the corona ring 20 may not effectively prevent corona discharge.

FIG. 2 shows an exemplary electrical circuit diagram 48 that may be used by some embodiments. This particular example shows the electrical bonding cables 23 in a series configuration. Power source 42 comprises a positive terminal 46 and negative terminal 44. The negative terminal 44 is wired to first resistance 50, which may correspond to the first electrical bonding cable 24 as shown in FIG. 1 and a first conductive component as to allow current to flow through the resistance. The current in the wire continues through second resistance 52, which may correspond to the second electrical bonding cable 26 as shown in FIG. 1 and a second conductive component. The current in the wire then continues through third resistance 54 which may correspond to third electrical bonding cable 28 as shown in FIG. 1 and a third conductive component. The current in the wire continues through fourth resistance 56, which may correspond to the fourth electrical bonding cable 30 as shown in FIG. 1 and a fourth conductive component. The current in the wire continues through fifth resistance 58, which may correspond to the fifth electrical bonding cable 32 and a fifth conductive component. Finally, the current is sent along feedback wire 34 to electronic control module 36. Fewer or more electrical bonding cables 23 may be employed in the aerial device 10 in some other embodiments of the invention. Control module 36 is wired to both positive terminal 46 and negative terminal 44 of power source 42. Control module 36 may include a pull-up resistor 38 wired parallel to the series of resistances, placed between a node of the feedback wire 34 and positive terminal 46 of power source 42.

During operation, the circuit may be powered by power source 42, which supplies a voltage and current. The current flows through the series of resistances and each resistance causes a voltage drop. When the signal reaches the electronic control module 36, the signal can be processed to determine if an elevated resistance is observed from the series of resistances by comparing the measured voltage with an expected voltage value associated with an acceptable operation of the system according to the predetermined acceptance standard. The pull-up resistor 38 may be used to calibrate the system to achieve a specific resolution. If an elevated resistance is observed, the elevated resistance may be indicative of a damaged or broken electrical bonding cable, conductive component, or connection therebetween. In this case, the electronic control module 36 may perform operations to notify the operator of poor bonding conditions, and in some cases, disable certain functions of the device, as discussed in more detail below.

In some embodiments, the condition of the electrical bonding cables 23 is monitored by observing an electrical voltage associated with an electrical resistance provided by running current through the electrical bonding cables 23. In such embodiments the electrical circuit 48 is created comprising electronic control module 36, power source 42, pull-up resistor 38, and the plurality of electrical bonding cables 23 attached to a respective plurality of conductive components. The electrical bonding cables 23 serve as the network of series resistors 50-58 in parallel with the pull-up resistor. The pull-up resistor 38 may be internal to the electronic control module 36 and allows the input to the electronic control module 36 to effectively measure a voltage differential relative to the power source 42, which in some embodiments, may be a battery.

In some embodiments, the electrical circuit 48 may be configured as follows. The plurality of electrical bonding cables 23 is configured in a series formation as a series of electrically connected electrical bonding cables 23. The electrical connections of the electrical bonding cables 23 may be through attachments to conductive components, such that current may travel from the first electrical bonding cable 24 through the conductive component and into a second electrical bonding cable 26. One end of the series of electrical bonding cables 23 may be connected to a ground terminal of the power source 42. Feedback wire 34 is connected to the corona ring 20 and runs to a low-side analog input on the electronic control module 36. The low-side input is equipped with pull-up resistor 38 that allows the input to measure a voltage. The principle of voltage dividers is used to determine an equivalent resistance associated with the series of electrical bonding cables 23. If the series of electrical bonding cables 23 produces an elevated resistance, the elevated resistance may be due to damage or a defect within at least one of the electrical bonding cables 23, the conductive components, or connections therebetween, such as, for example deterioration or corrosion. If the system measures a voltage corresponding to a resistance outside of a pre-determined range, or if the system otherwise determines a resistance level does not satisfy a predetermined acceptance standard, the system may be configured to alert the operator via a light and/or audible alarm or some other means of notification.

The resistance value of the electronic control module's pull-up resistor 38 may be varied during the design phase of the electrical circuit 48 to provide better resolution at lower resistances, though the variation of the resistance value may come at the expense of increased power consumption through the electrical circuit 48. The electrical circuit 48 could be optimized to be implemented in various situations. One exemplary embodiment of the invention includes a circuit that draws 12 milliamperes continuously at 12 volts from the power source 42, which may be a battery or any type of alternative power source. The exemplary system comprises a 1 kiloohm pull-up resistor. If high resolution between 0 ohms and 5 ohms is required a pull-up resistor of less than 50 ohms may be desirable. As such the pull-up resistor 38 can easily be sized according to the desired resolution range desired for specific applications.

In certain embodiments it may be desirable to continuously run current through the system. However, it may be beneficial to sample at various other rates according to the parameters of the circuit such as, for example, current, voltage, and resistance. In cases where power should be conserved, and especially when the system draws a high amount of power, it may be desirable for the system to be configured to sample briefly at a given interval via the incorporation of a method of interrupting the current flow into the system during non-sampling portions, such as, for example using a relay or switching FET (field-effect transistor). In some cases, it may be desirable to only sample upon the system receiving an operator input, or when the device is initially switched on. For example, the system may be configured to run upon an input from an operator, such as, for example, a button press. In this case, the condition monitoring is a preoperational step for use of the aerial device 10. The electrical bonding detection system may carry out a single run giving results to the operator, such as notification to the operator of the condition of each of the conductive components and their respective electrical bonding cables 23 individually, or the entire series of conductive components and the electrical bonding cables 23 collectively.

The sampling rate employed by the system may be modified according to specific working environments or based on operator preferences. For instance, the sampling rate may be implemented as a continuous sample to check the electrical bonding every 25 milliseconds. Alternatively, sampling may be implemented periodically to run a sample every 30 seconds, or over any other predetermined sampling rate specified by the operator.

In embodiments where the condition of each conductive component is to be monitored separately, there may be a plurality of feedback wires. Each feedback wire may be designated to a particular conductive component or electrical bonding cable to carry a voltage signal associated with the resistance of that particular conductive component or electrical bonding cable.

In certain embodiments, where the input signal is too low to be read by the electronic control module, an amplifier may be incorporated into the system to amplify the voltage of the input signal, so the input signal is more easily readable by the electronic control module. The amplifier may be incorporated into the electronic control module or exist as a separate component of the system. Additionally, the amplifier may be powered by the same power source used to power other components.

In certain embodiments, it may be desirable to use alternative circuit configurations. Such embodiments may include a circuit configuration that places the conductive components in parallel with one another. This may be a desirable configuration because the condition of each conductive component can be monitored individually. While in series, a single voltage signal representative of the resistance of the collection of components and cables is observed. Alternate circuit configurations may allow the condition of each conductive component and electrical bonding cable to be monitored separately, in order to diagnose specific issues in the system. Some such embodiments may notify the operator of the specific component that has become damaged or broken to aid in the maintenance of the aerial device 10.

Figure 3:
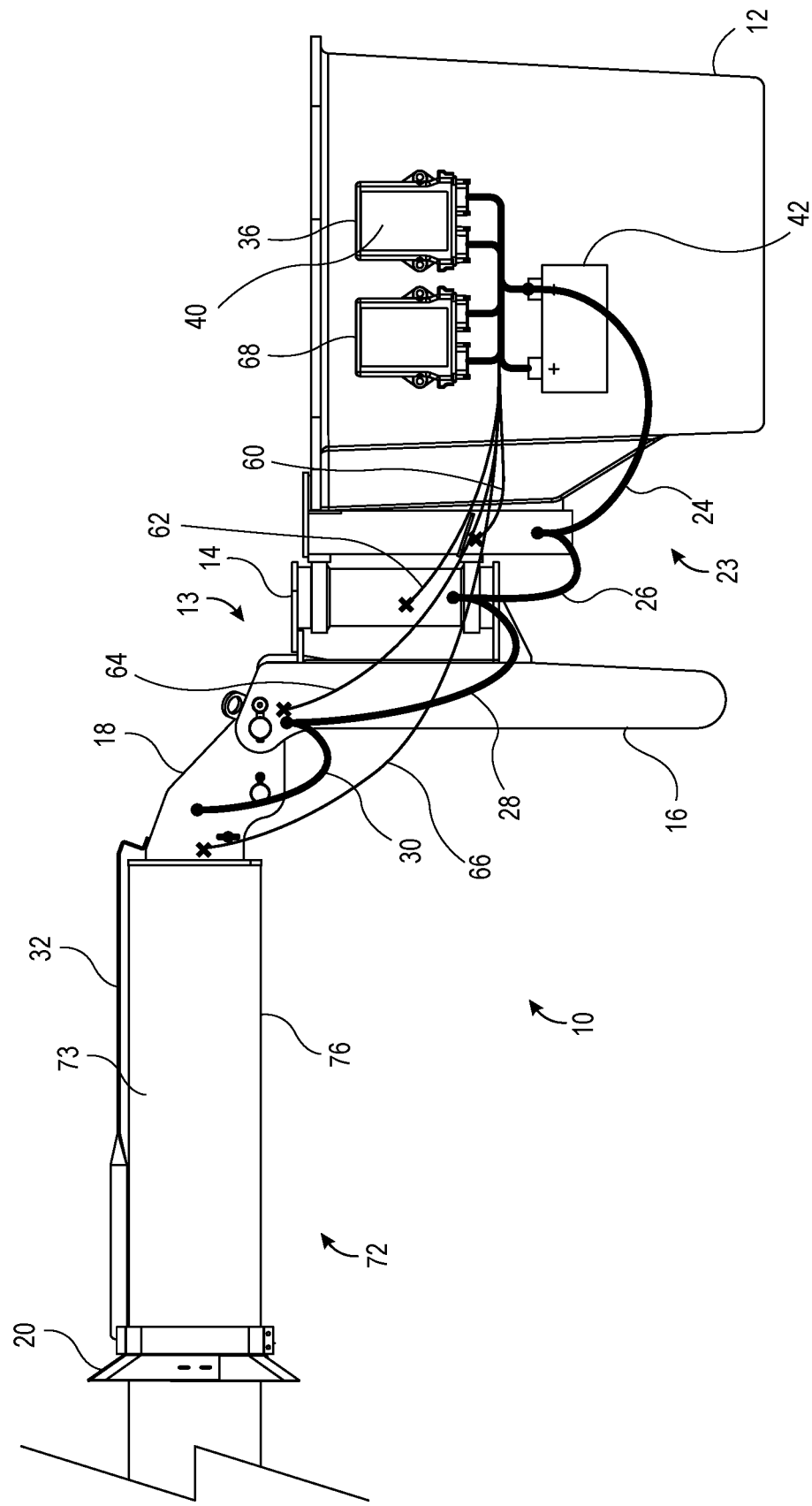
FIG. 3 is a schematic of a boom assembly with an insulating aerial device relating to an exemplary embodiment of the invention.

FIG. 3 shows an exemplary diagram of an aerial device 10 relating to a particular embodiment of the invention. The aerial device 10 may be secured to the utility vehicle 70, as shown in FIG. 5. In some embodiments, the aerial device 10 may be electrically insulated for use in close proximity to an energized power line. The aerial device 10 comprises platform 12, attachment assembly 13, and boom assembly 72. The platform 12 may be attached to the attachment assembly 13. The attachment assembly 13 comprises platform rotator 14 and leveling bracket 16. The platform 12 may be attached to the attachment assembly 13 via attachment of the platform 12 to platform rotator 14, which may be pivotally connected to leveling bracket 16. The boom assembly 72 comprises a boom 73 having a distal end 76 that includes a boom tip 18. The platform 12, platform rotator 14, leveling bracket 16, and boom tip 18 may be conductive components. The boom assembly 72 may further comprise a corona ring 20, positioned at the distal end 76 of the boom assembly 72, to maintain the conductive components at equal electrical potential. The conductive components may be electrically connected via a plurality of electrical bonding cables 23. The corona ring 20 may be operable as gradient control device to prevent electrical discharges by evenly distributing the electric field gradient. The corona ring 20 may be electrically connected to the boom tip 18. The components of the aerial device 10 may be electrically connected via a plurality of electrical bonding cables 23. In some embodiments, the plurality of electrical bonding cables may comprise: a first electrical bonding cable 24 connected to negative terminal of a power source 42 and attached to platform 12; a second electrical bonding cable 26 attached to platform 12 and platform rotator 14; a third electrical bonding cable 28 attached to platform rotator 14 and leveling bracket 16; and a fourth electrical bonding cable 30 attached to leveling bracket 16 and boom tip 18. A first feedback wire 60 may be connected to the platform 12 and to the electronic control module 36. A second feedback wire 62 is connected to the platform rotator 14 and to electronic control module 36. A third feedback wire 64 is connected to the leveling bracket 16 and to electronic control module 36. A fourth feedback wire 66 is connected to the boom tip 18 and to electronic control module 36. An amplification module 68 may be incorporated to amplify voltage signals before they are sent to the electronic control module 36. The amplification module 68 may be placed adjacent to or incorporated as a subcomponent of the electronic control module 36. The electronic control module 36 is wired to power source 42 at both the positive and negative terminals.

FIG. 3 will now be described in operation. During operation the aerial device 10 may be positioned adjacent to an energized power line, so an operator can perform maintenance operations on said power line. The conductive components, which may be platform 12, platform rotator 14, leveling bracket 16, and boom tip 18, are electrically bonded via a plurality of electrical bonding cables 23, keeping all of the conductive components at an equal electrical potential. Each of the feedback wires 60-66 carry a voltage signal from the particular conductive component to which they are attached, to an amplification module 68. The amplification module 68 amplifies the voltage signal so the voltage signal is more easily readable by the electronic control module 36. The amplified voltage signals are received as inputs by the electronic control module 36, which processes the inputs and is programmed to carry out output operations accordingly. For instance, the electronic control module 36 may receive signals via each of the feedback wires 60-66 for the conductive components: platform 12, platform rotator 14, leveling bracket 16, and boom tip 18, respectively. The signals are processed and it is observed that the signals from feedback wires 60-66 contain an acceptable voltage based on the predetermined acceptance standard, while the signal from fourth feedback wire 66 contains an unacceptable voltage based on the predetermined acceptance standard. Thus, the signal of the fourth feedback wire 66 is deemed unacceptable as being indicative of an increased resistance of the fourth electrical bonding cable 30 attached to the boom tip 18. The electronic control module 36 then sends a signal to notify the operator that the boom tip 18 or its electrical bonding cable 30 may have become damaged and that operation of the aerial device 10 is not recommended. In some embodiments, the electronic control module 36 may automatically disable device functions of the utility vehicle 70, as shown in FIG. 5, to prevent operation when a poor condition of any of the conductive components has been observed. Having received notification of the specific component that has become damaged or broken, the operator can diagnose the issue more quickly and is better suited to perform maintenance and repair operations on the components of the aerial device 10.

Figure 4:
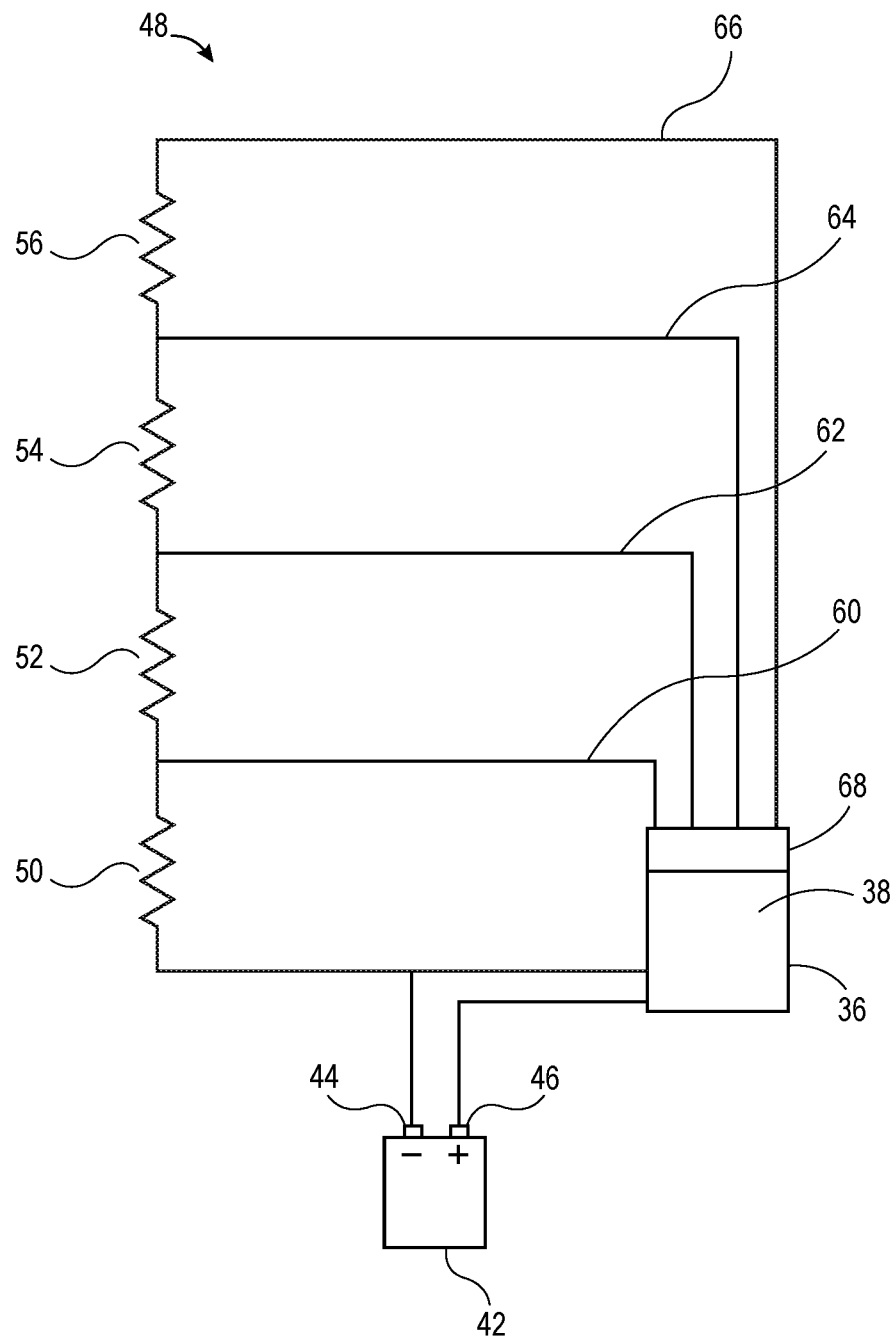
FIG. 4 is a circuit diagram relating to an exemplary embodiment of the invention.

FIG. 4 shows an exemplary circuit diagram that may be applied within certain embodiments. In this particular embodiment, the conductive components are wired in parallel with one another. The benefit of the parallel configuration is that the conductive components can be analyzed individually. The electrical circuit 48 may be configured as follows. Power source 42 may be a battery or any other means of supplying power to the system and comprises a positive terminal 46 and negative terminal 44. The negative terminal may be wired to a first resistance 50. After going through the first resistance a common node may be wired to a second resistance 52 and the first feedback wire 60. Positioned after the second resistance 52 may be a common node wired to the third resistance 54 and a second feedback wire 62. Positioned after the third resistance 54 may be a common node wired to a fourth resistance 56 and the third feedback wire 64. Positioned after the fourth resistance 56 may be a node wired to a fourth feedback wire 66. Each of the feedback wires 60-66, run to the electronic control module 36. It may be desirable to include an amplification module 68, which may be positioned adjacent to or within the electronic control module 36. The feedback wires may carry the signals first to the amplification module 68 and then to the microprocessor 40 of the electronic control module 36. The electronic control module 36 may be powered by the power source 42 via wires to the positive terminal 46 and negative terminal 44.

During operation the power source 42 supplies a voltage and current to the system. As current is passed through each resistance, which may correspond to a specific conductive component and electrical bonding cable, the current experiences a voltage drop that is indicative of the resistance of the conductive component, electrical bonding cable, and connection therebetween. The plurality of feedback wires 60-66 carry a voltage signal to the electronic control module 36. The signals may first be amplified by the amplification module 68, so they are more easily readable by the electronic control module 36. The electronic control module 36 may also include a plurality of pull-up resistors 38. The electronic control module 36, based at least in part on the signals from the feedback wires 60-66, can determine the electrical bonding condition of each of the conductive components, and is operable to notify an operator of the condition, and in some cases, disable certain device functions.

In certain embodiments, the system may receive a constant current source into the electrical circuit 48. The electrical circuit 48 may incorporate the amplification module 68 to amplify voltage differential signals that are too low to be easily read by the electronic control module 36. The amplification module 68 may be a differential voltage amplifier that receives and amplifies the low voltage signals so they are readable by the electronic control module 36. In some cases, the received differential voltage signals may be less than a millivolt. The electronic control module 36 may be further equipped with a conversion device for converting analog signal to digital signal or digital to analog signal to communicate with other electronic devices of the utility vehicle 70. The input signal may experience a number of transformations before being processed according to the specific equipment and desired signal type of the microprocessor 40. The signal may not be a standard voltage signal when received by the microprocessor 40 but may be converted to a digital signal or the like.

In some embodiments, the predetermined acceptance standard may be a range of voltage values that correspond to undamaged conductive components, electrical bonding cables 23, and connections therebetween. In some such embodiments, the predetermined acceptance standard may be set during the initial setup of the equipment. For instance, an operator may be setting up a new utility vehicle 70 equipped with an aerial device 10. The operator is confident that the conductive components, electrical bonding cables 23, and connections therebetween have not been damaged and may perform manual tests using a multi-meter. The operator may then initiate a reading or calibration step of the electronic control module 36 to save the input signal as a base point for the predetermined acceptance standard. The predetermined acceptance standard may use a voltage of the input signal as a base value and classify voltages within a certain range of the base value as acceptable and classify voltages outside of the range as unacceptable.

FIG. 5 shows the utility vehicle 70 with an aerial device 10 comprising a boom assembly 72 and a platform 12. The boom assembly 72 comprises a boom 73 with a proximal end 74 and distal end 76. The boom assembly 72 may be mounted onto a bed of the utility vehicle 70. The platform 12 may be attached to the boom assembly 72 by the attachment assembly 13, as shown in FIGS. 1 and 3 at the distal end 76 of the boom assembly 72. The distal end 76 may include boom tip 18, as shown in FIGS. 1 and 3. The platform 12 and boom tip 18 may be conductive components. In some embodiments, the aerial device 10 may further comprise a plurality of additional conductive components, such as, for example, leveling bracket 16, and platform rotator 14, as shown in FIGS. 1 and 3. The leveling bracket 16 and platform rotator 14 may be positioned between the distal end 76 of boom assembly 72 and the platform 12.

During operation, the utility vehicle 70 may be driven to a destination having an energized power line in need of maintenance. The utility vehicle 70 is secured to the boom assembly 72 of the aerial device 10, which may be folded down and fully retracted while driving. Once the destination has been reached, the utility vehicle 70 stops and may deploy outriggers to stabilize the utility vehicle 70 during operation of the boom assembly 72. The boom assembly 72 may then be operated to extend the telescoping boom sections so that the distal end 76 is raised upwards as to position the platform 12 adjacent to an energized power line. The boom assembly 72 may be rotated about a vertical axis where the proximal end 74 of the boom assembly 72 may be attached to the utility vehicle 70 to aid in the positioning of the boom 73. An operator may be positioned on the platform 12 and can now begin maintenance operations on the energized power line. During operation, the energized power line may be electrically bonded directly to the aerial device 10 at the platform 12. The conductive components of the aerial device 10 may be electrically bonded via a plurality of electrical bonding cables 23, as shown in FIGS. 1 and 3. It is desirable that all conductive components remain at a common electrical potential to avoid electrical gradients, especially while bonding the conductive components to an energized power line. The corona ring 20, as shown in FIGS. 1 and 3, may also be electrically connected to the conductive components to function as a gradient control device. For the system to maintain proper electrical bonding of the conductive components and the corona ring 20, it is desirable that none of the electrical bonding cables 23, conductive components, and connections therebetween become damaged or broken. Damage such as, for example, corrosion, may inhibit the system's ability to maintain an equal electrical potential among the conductive components.

A notification device may be used to notify the operator of the condition of the electrical bonding cables 23 and their connections. In some embodiments, the notification device may be controlled, operated by, or may be the microprocessor 40 at least one other processor. The notification device may be an alarm or light. Alternatively, the notification device may be a screen display, or an array of LEDs. The signal may be sent from the electronic control module to a computer system of the utility vehicle 70 or may even be sent wirelessly to an operator device. The notification device may be configured to simply communicate an overall state of acceptability. For example, a red light may be activated when an operating parameter or condition outside the predetermined acceptance standard (i.e., a "poor condition") is observed by the system, and a green light or no light may be activated when the system detects an overall acceptable condition (i.e., detected operating parameters or conditions are within the predetermined acceptance standard). In some embodiments, the notification device may be placed on the platform 12 of the aerial device 10, or on the utility vehicle 70 in a bed or center console of utility vehicle 70.

More sophisticated embodiments may include a notification device that is configured to notify the operator of the specific point in the system where the poor condition has been detected. For example, the notification device may include a display that depicts the utility vehicle 70 and each of its conductive components of the boom assembly 72. On the display, at each conductive component, an LED may be positioned to signal the condition of the conductive component, the electrical bonding cables attached to the conductive component, and the connections therebetween with colors, light intensity, or numeric values representative of the condition. In systems that already utilize a display screen run by output from a centralized computer system of the utility vehicle 70, a conductive component notification system may be incorporated into the existing centralized computer system to be displayed on the display screen.

In some embodiments, the condition of the conductive components may be communicated electronically via telematics, so the aerial device 10 could be serviced without detriment to the operator's work schedule. In this case, the operator that receives the notification may not be the operator of that specific device but an additional personnel or system that handles maintenance scheduling. In some cases, the scheduling system may automatically schedule device maintenance according to the notification signal and may even automatically order replacement parts according to the specific components that are found to be in unacceptable condition in order to reduce the downtime associated with repair and repair part shipping.

In some embodiments, the system may comprise a graphical user interface (GUI), which may include a screen or other display to notify the operator of the condition of the conductive components and receive input from the operator. Operator inputs may be a request for a single sample to check the condition of the conductive components, a desired sampling rate, or a request for a condition check for a specific individual conductive component. In certain embodiments the system may be equipped with a feature to repress an output response from the electronic control module according to input from the operator or a state of the utility vehicle 70. The GUI may be desirable in situations while the aerial device 10 is being bonded to an energized power line. During the bonding process the circuit may receive additional noise associated with the bonding that could cause the electronic control module 36 to produce an output response that is not necessarily indicative of the condition of the conductive components. For this reason, it may be desirable to include an option for repressing the output response for certain situations. This repression option may be based on an operator input received from a button or as an operator input to the GUI. Alternatively, the option to repress the electronic control module 36 output may be based on a state of the aerial device 10. For instance, the aerial device 10 may enter a specific, pre-set state during the bonding process according to the electronic control module 36 of the aerial device 10 or a centralized control unit of the utility vehicle 70, where entering or activation of the pre-set state automatically represses output of the electronic control module 36.

In addition to a notification, the electronic control module 36 may be configured to produce additional outputs. In some embodiments, the electronic control module 36 may be configured to automatically disable device functions according to a received input signal. For example, the system may be used on a utility vehicle 70 having a centralized control unit, which an operator uses to control various functions of a boom. The electronic control module 36 may be operable to communicate with the centralized control unit to disable certain functions of the aerial device 10 such as, boom extension, when an unacceptable condition is observed by the electronic control module 36, adding the additional safety measure of completely disabling functions that could lead to unacceptable conditions and harm to the machinery. In some embodiments, the electronic control module 36 may prevent the aerial device 10 from entering the bonding state to ensure that electrical bonding is not attempted when an issue in the electrical bonding cables 23, conductive components, or connections therebetween has been observed.

Figure 6:
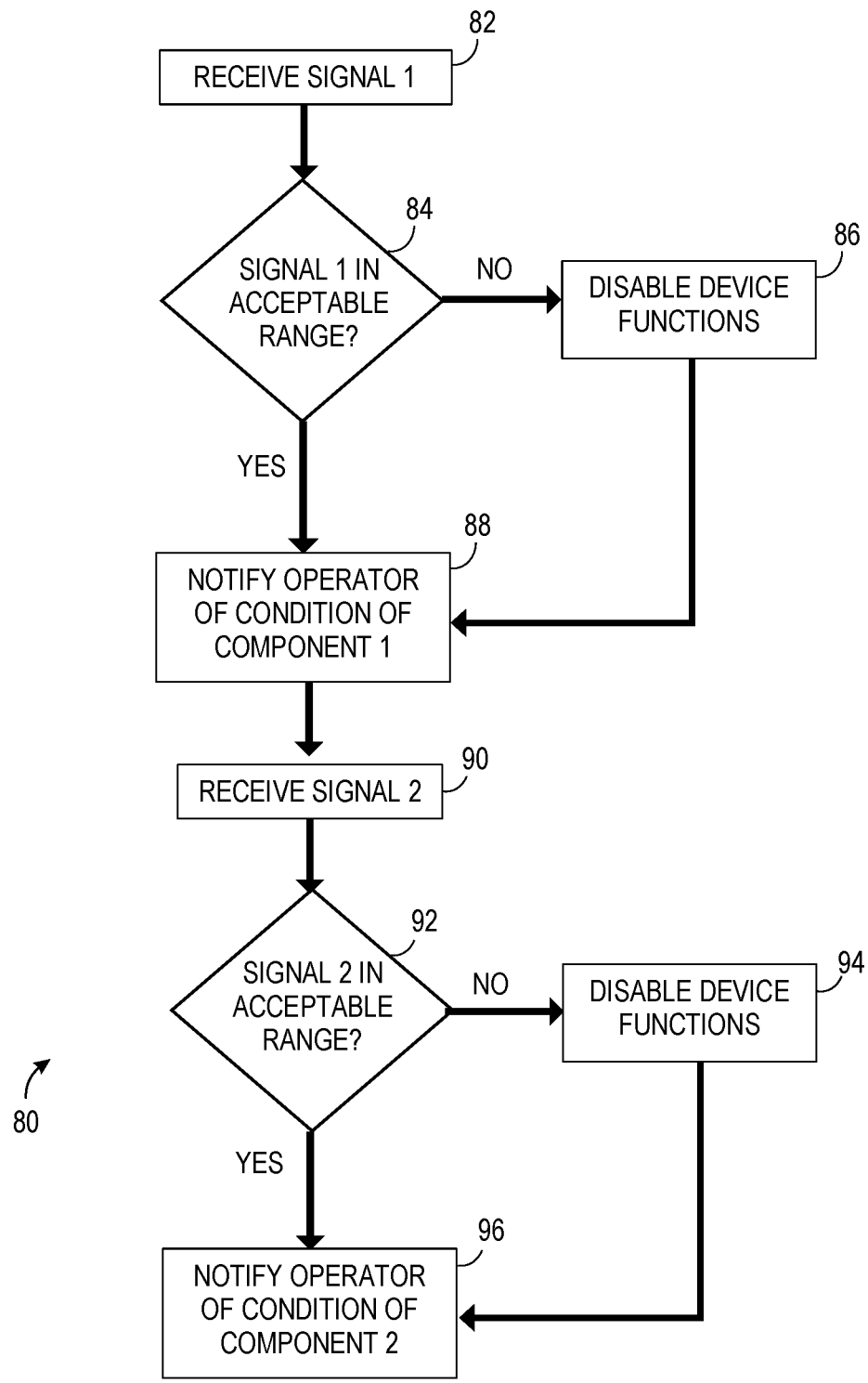
FIG. 6 is an exemplary control schematic relating to some embodiments of the invention.

FIG. 6 shows an exemplary control schematic 80 that may be carried out by the microprocessor 40 of the electronic control module 36, as shown in FIGS. 1 and 3, in some embodiments. First the electronic control module receives a first input signal at Step 82. The signal is associated with the condition of first electrical bonding cable 24, as shown in FIGS. 1 and 3, connected to a first component. At Step 84 the electronic control module 36 determines whether the first input signal is within an acceptable range according to the predetermined acceptance standard. If the signal is found to be outside of the acceptable range the electronic control module 36 moves to Step 86 and may disable certain device functions. At Step 88 the electronic control module 36 notifies the operator of the condition of the first electrical bonding 24 cable via a notification device which may be a light, audible alarm, or screen display. At Step 90, the electronic control module 36 receives a second input signal associated with the condition of second electrical bonding cable 26, as shown in FIGS. 1 and 3, connected to a second component, where at Step 92 the signal is measured to determine whether the signal falls within an acceptable range. If the signal is out of the acceptable range certain device functions may be disabled by the electronic control module 36 at Step 94. At Step 96 the electronic control module 36 notifies the operator of the condition of the second component. The control scheme may be extended according to any number of additional components, receiving an input signal for each component. The electronic control module 36 may perform similar operations for all additional components.

The components herein may be conductive components of the boom assembly 72, attachment assembly 13, or platform 12, as well as electrical bonding cables 23, or the connections between the electrical bonding cables 23 and the conductive components. In some embodiments, the condition of the conductive components, the electrical bonding cables 23, and the connections therebetween are monitored collectively to determine if sufficient electrical bonding is present.

Figure 7:
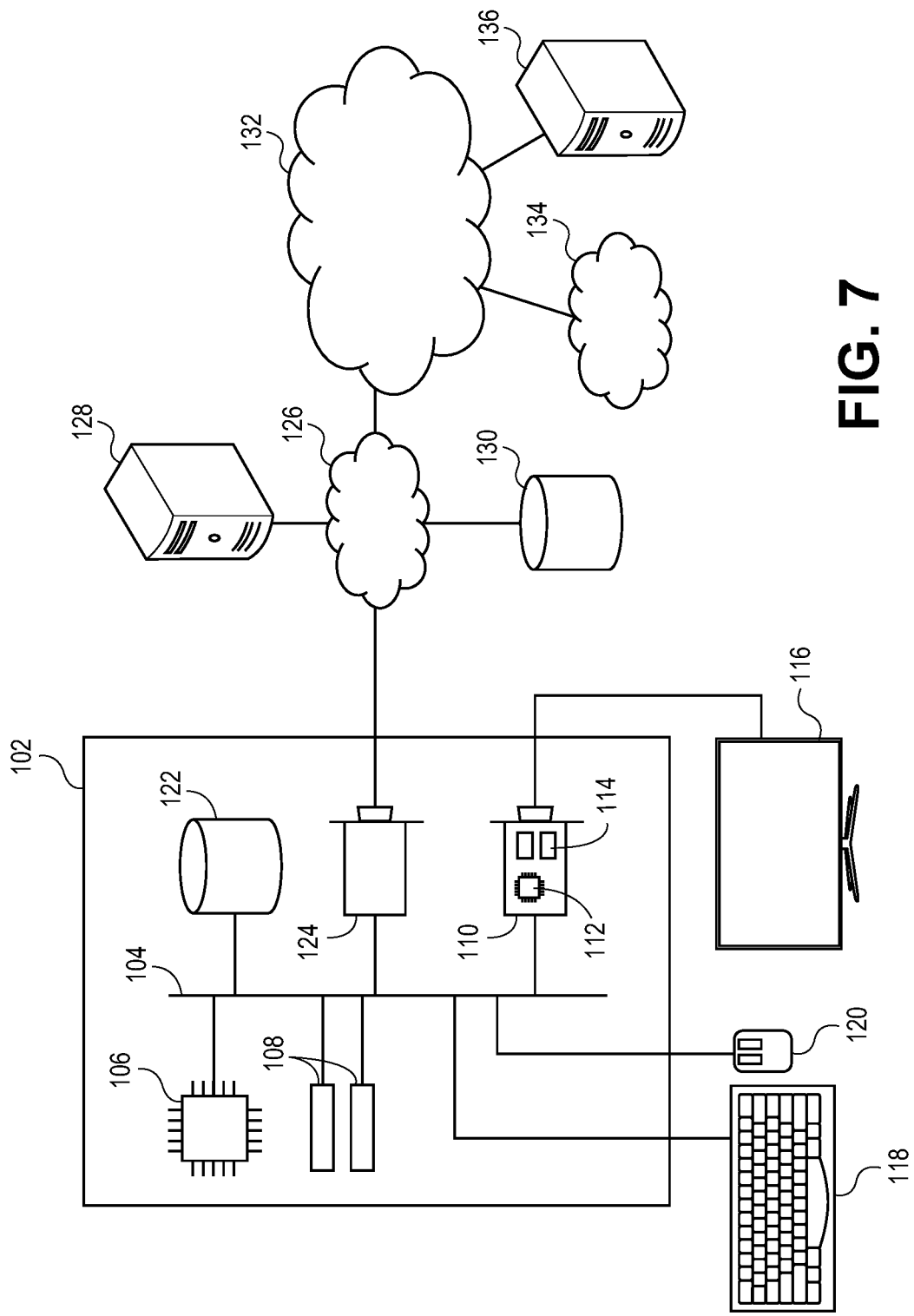
FIG. 7 depicts an exemplary hardware platform for some embodiments of the invention.

Turning to FIG. 7, an exemplary hardware platform for certain embodiments of the invention is depicted. Computer 102 can be a desktop computer, a laptop computer, a server computer, a mobile device such as a smartphone or tablet, the electronic control module 36 as shown in FIGS. 1 and 3, a centralized computer of the utility vehicle 70 as shown in FIG. 5, or any other form factor of general- or special-purpose computing device. Depicted with computer 102 are several components, for illustrative purposes. In some embodiments, certain components may be arranged differently or absent. Additional components may also be present. Included in computer 102 is system bus 104, whereby other components of computer 102 can communicate with each other. In certain embodiments, there may be multiple busses or components may communicate with each other directly. Connected to system bus 104 is central processing unit (CPU) 106. Also attached to system bus 104 are one or more random-access memory (RAM) modules 108. Also attached to system bus 104 is graphics card 110. In some embodiments, graphics card 110 may not be a physically separate card, but rather may be integrated into the motherboard or the CPU 106. In some embodiments, graphics card 110 has a separate graphics-processing unit (GPU) 112, which can be used for graphics processing or for general purpose computing (GPGPU). Also on graphics card 110 is GPU memory 114. Connected (directly or indirectly) to graphics card 110 is display 116 for user interaction. In some embodiments no display is present, while in others it is integrated into computer 102. Similarly, peripherals such as keyboard 118 and mouse 120 are connected to system bus 104. Like display 116, these peripherals may be integrated into computer 102 or absent. Also connected to system bus 104 is local storage 122, which may be any form of computer-readable media, and may be internally installed in computer 102 or externally and removeably attached.

Computer-readable media include both volatile and non-volatile media, removable and nonremovable media, and contemplate media readable by a database. For example, computer-readable media include (but are not limited to) RAM, ROM, EEPROM, flash memory or other memory technology, CD-ROM, digital versatile discs (DVD), holographic media or other optical disc storage, magnetic cassettes, magnetic tape, magnetic disk storage, and other magnetic storage devices. These technologies can store data temporarily or permanently. However, unless explicitly specified otherwise, the term "computer-readable media" should not be construed to include physical, but transitory, forms of signal transmission such as radio broadcasts, electrical signals through a wire, or light pulses through a fiber-optic cable. Examples of stored information include computer-usable instructions, data structures, program modules, and other data representations.

Finally, network interface card (NIC) 124 is also attached to system bus 104 and allows computer 102 to communicate over a network such as network 126. NIC 124 can be any form of network interface known in the art, such as Ethernet, ATM, fiber, Bluetooth, or Wi-Fi (i.e., the IEEE 802.11 family of standards). NIC 124 connects computer 102 to local network 126, which may also include one or more other computers, such as computer 128, and network storage, such as data store 130. Generally, a data store such as data store 130 may be any repository from which information can be stored and retrieved as needed. Examples of data stores include relational or object-oriented databases, spreadsheets, file systems, flat files, directory services such as LDAP and Active Directory, or email storage systems. A data store may be accessible via a complex API (such as, for example, Structured Query Language), a simple API providing only read, write and seek operations, or any level of complexity in between. Some data stores may additionally provide management functions for data sets stored therein such as backup or versioning. Data stores can be local to a single computer such as computer 128, accessible on a local network such as local network 126, or remotely accessible over Internet 132. Local network 126 is in turn connected to Internet 132, which connects many networks such as local network 126, remote network 134 or directly attached computers such as computer 136. In some embodiments, computer 102 can itself be directly connected to Internet 132.

In some embodiments of the invention, the computer executable program may be stored on the local storage of the computer 102. The computer 102 may be operable to communicate with the electronic control module 36. In some embodiments, the notification device may be the display 116, which may be attached to the platform 12 or positioned in the utility vehicle 70. In some embodiments, the computer 102 may utilize either the local network 126 or the internet 132 to communicate a signal indicative of the condition of at least one of the conductive components.

In some embodiments, that include electrical bonding cables 23, the electrical bonding cables 23 may be considered as conductive components and the system may monitor the condition of the electrical bonding cables 23 alone or the electrical bonding cables 23 and the conductive components to which they are attached.

In some cases, it may be desirable to implement a signal filter into the monitoring system to eliminate noise within the signal or to ignore electrical disturbances. The system may be subject to electrical disturbances, especially during the bonding or unbonding process from an energized power line. The disturbances may affect the input signals to the electronic control module 36, which could result in a faulty signal, such as the electronic control module flagging a component as being in poor condition when the component is not actually in poor condition. For this reason, it may be desirable to incorporate a signal filter into the system that may suppress the electronic control module 36 output during certain operations where electrical disturbances may occur, such as during the bonding process and the unbonding process. In some embodiments, the signal filter may be placed within the electronic control module 36. Other elements could be implemented to solve the problems of electrical disturbances and signal noise. For example, an input switch could be implemented into the electronic control module 36 to ignore the input signal according to operator input. The operator may engage the input switch to ignore the input signal. Alternatively, the switch may be controlled automatically according to a state saved in the electronic control module 36 associated with the aerial device 10 or utility vehicle 70. For example, the switch may be automatically engaged when the aerial device 10 is in a bonding/unbonding state.

In some embodiments, the electronic control module 36 is equipped with the microprocessor 40 that may be preprogrammed with voltage range values. When the input voltage signal is received by the electronic control module 36, the microprocessor 40 determines whether the input voltage falls within the predetermined acceptance standard, which may include a preset range for the voltage. If the voltage is outside of the preset range, or if the input voltage otherwise does not satisfy the predetermined acceptance standard, the voltage signal may indicate that at least one of the plurality of electrical bonding cables 23 or connections is damaged or broken. Accordingly, the system notifies the operator via an alarm, light, or some other form of notification. The notification may alert the operator of damaged or broken electrical bonding cables 23 before they can become a hazard for the equipment.

In some embodiments, the microprocessor 40 may be programmed to analyze the signals in order to differentiate between varying levels of damage to the electrical bonding cables 23 or conductive components to identify whether the signals are indicative of slight damage or severe damage, such as a completely broken conductive component or severed electrical bonding cable. In such embodiments, the electronic control module 36 may send information to the notification device accordingly to notify the operator of the level of damage observed for each conductive component. The information may be used in diagnosing the specific problems with the device and preparing the maintenance operations. In embodiments where telematics are used to order replacement parts, the information may be used to determine the specific replacement parts or means of repair that should be requested.

Embodiments are not limited to the aerial device 10 and may be applied in various alternative fields to monitor the condition of conductive components. It may be desirable to apply the system to structural applications to monitor for corrosion or deterioration in structural components, or in other electrical applications where the electrical resistance of specific components is of concern to the operator.

In addition to monitoring the condition of conductive components of the aerial device 10, as shown in FIGS. 1, 3, and 5, the technology could be incorporated into various structural applications such as, for example, monitoring the condition of metal beams of a bridge and their connections, which may be welds or another form of metallic fastener means. The technology, in this case, is helpful in identifying the onset of corrosion or other failure modes before they are a risk to the structural integrity of the structural components.

In embodiments where the technology is incorporated into structural components, the circuitry may be implemented similarly to that previously discussed for the aerial device 10, however, the conductive components may be structural metal components used to support a structure. Currently, structural components may be monitored by strain gauges to detect the strain experienced by the various components. In some embodiments, the technology is incorporated alongside preexisting strain gauges to monitor both strain and defects associated with corrosion. Certain embodiments of the invention could be applied in structural systems to monitor the condition of fastener components such as, for example, bolts, welds, and rivets. In many systems, fastener components are vital to maintaining structural integrity, so it is desirable to monitor the fastener components before certain defects, such as corrosion, lead to failure. Similar to the conductive components of an aerial device 10, corrosion in metallic fastener components may create an increased resistance, that can be detected by the electronic control module 36 via an input signal carried by a feedback wire. Microprocessor 40 may then carry out a notification step if an unacceptable condition is observed according to the predetermined acceptance standard, to notify a user of the condition. In such embodiments, the user may be a maintenance operator, wherein it is desirable for the maintenance operator to monitor the condition of the structural components. In embodiments where the invention is integrated into structural components of a bridge the user may be maintenance personnel performing a check on the bridge components to determine whether repair is necessary.

In addition to structural components, certain embodiments of the invention may be applied to other electrical systems that require conductive components be grounded. In such embodiments, a plurality of grounding cables of the conductive components may be monitored via a plurality of feedback wires carrying signal from the conductive components to electronic control module 36, which uses the signal to determine the condition of the conductive components, grounding cables, or connections therebetween. In some electrical systems it is desirable to monitor the conductive components to ensure that a consistent common ground is held by each of the conductive components. Similar to embodiments where the system is integrated into the aerial device 10, damage to the conductive components or connections therebetween creates an elevated resistance causing a voltage drop, that can be analyzed by the electronic control module 36 to determine the condition of the conductive component. In grounding applications, it is also desirable that all conductive components remain at a similar electrical potential.

Although the invention has been described with reference to the embodiments illustrated in the attached drawing figures, it is noted that equivalents may be employed, and substitutions made herein without departing from the scope of the invention as recited in the claims.

Having thus described various embodiments of the invention, what is claimed as new and desired to be protected by Letters Patent includes the following:

1. An electrical bonding detection system for detecting inhibited electrical bonding for a plurality of electrical bonding cables connected to a respective plurality of conductive components, wherein the conductive components are located at a distal end of a boom assembly of an aerial device, the bonding detection system comprising:

a power source;
a feedback wire carrying an input signal from at least one of the plurality of conductive components;
an electronic control module including a microprocessor associated with a memory comprising a non-transitory computer-readable medium storing instructions to perform the following steps:
receiving the input signal from at least one of the plurality of conductive components;
determining if the input signal satisfies a predetermined acceptance standard,
wherein the plurality of electrical bonding cables maintain the plurality of conductive components at a substantially equal electrical potential,
wherein the predetermined acceptance standard includes a voltage range indicative of a condition associated with the electrical bonding of at least one of the plurality of electrical bonding cables; and
if the input signal does not satisfy the predetermined acceptance standard, notifying an operator of the condition of the at least one of the plurality of electrical bonding cables.

2. The electrical bonding detection system of claim 1, further comprising a pull-up resistor wired between an input channel of the electronic control module and a positive terminal of the power source.

3. The electrical bonding detection system of claim 1, further comprising a gradient control device wired to the plurality of conductive components via a plurality of electrical bonding cables.

4. The electrical bonding detection system of claim 1, wherein the aerial device is an insulating aerial device for use in proximity to an energized power line, wherein the plurality of conductive components is electrically bonded to the energized power line.

5. The electrical bonding detection system of claim 4, wherein the electronic control module automatically disables at least one function of the insulating aerial device if the input signal does not satisfy the predetermined acceptance standard.

6. The electrical bonding detection system of claim 1, further comprising a differential voltage amplifier to amplify the input signal before the input signal is received by the microprocessor of the electronic control module.

7. The electrical bonding detection system of claim 1, wherein the feedback wire is a first feedback wire of a plurality of feedback wires, wherein each feedback wire of the plurality of feedback wires is associated with a respective conductive component of the plurality of conductive components and carries a respective input signal from the respective conductive component to the electronic control module.

8. An aerial device having a boom assembly, the aerial device comprising:
a plurality of conductive components comprising:
a platform;
a platform rotator attached to the platform;
a leveling bracket attached to the platform rotator; and
a boom tip at a distal end of the boom assembly attached to the leveling bracket;
an electrical bonding detection system comprising:
a plurality of electrical bonding cables attached to the plurality of conductive components to maintain the plurality of conductive components at a similar electrical potential;
a power source;
a feedback wire carrying an input signal from at least one of the plurality of electrical bonding cables; and
a control module including at least one microprocessor associated with a memory comprising a non-transitory computer-readable medium storing instructions to perform the following steps:
receiving the input signal from the feedback wire;
determining if the input signal satisfies a predetermined acceptance standard,
wherein the predetermined acceptance standard includes a voltage range indicative of a condition associated with the electrical bonding of the at least one of the plurality of electrical bonding cables; and
if the input signal does not satisfy the predetermined acceptance standard, notifying an operator of the condition of the at least one of the plurality of electrical bonding cables.

9. The aerial device of claim 8, further comprising a pull-up resistor wired between an input channel of the control module and a positive terminal of the power source.

10. The aerial device of claim 8, further comprising a gradient control device electrically connected to the plurality of conductive components via the plurality of electrical bonding cables.

11. The aerial device of claim 8, wherein the aerial device is electrically insulated for use in proximity to an energized power line.

12. The aerial device of claim 8, wherein the control module automatically disables at least one function of the boom assembly if the input signal does not satisfy the predetermined acceptance standard.

13. The aerial device of claim 8, wherein the feedback wire is a first feedback wire of a plurality of feedback wires, wherein each feedback wire of the plurality of feedback wires is associated with a respective electrical bonding cable of the plurality of electrical bonding cables and carries a respective input signal from the respective electrical bonding cable to the control module.

14. A non-transitory computer-readable storage medium storing computer executable instructions for monitoring electrical bonding of a plurality of electrical bonding cables connected to a respective plurality of conductive components of an aerial device, wherein the computer executable instructions instruct at least one microprocessor to perform the steps of:
receiving, from a feedback wire, an input signal associated with a resistance that is indicative of a condition associated with the electrical bonding of at least one of the plurality of electrical bonding cables;
determining if the input signal satisfies a predetermined acceptance standard,
wherein the plurality of electrical bonding cables maintain the plurality of conductive components at a similar electrical potential,
wherein the predetermined acceptance standard includes a voltage range indicative of the condition of at least one of the plurality of electrical bonding cables; and
if the input signal does not satisfy the predetermined acceptance standard, notifying an operator of the condition of the at least one of the plurality of electrical bonding cables.

15. The non-transitory computer-readable storage medium of claim 14, wherein a plurality of conductive components is electrically connected to a gradient control device via the plurality of electrical bonding cables.

16. The non-transitory computer-readable storage medium of claim 14, wherein the aerial device is an insulating aerial device for use in proximity to an energized power line, wherein the plurality of conductive components is electrically bonded to the energized power line.

17. The non-transitory computer-readable storage medium of claim 16, wherein the at least one microprocessor is programmed to automatically disable at least one function of the insulating aerial device if the input signal does not satisfy the predetermined acceptance standard.

18. The non-transitory computer-readable storage medium of claim 16, wherein the at least one microprocessor is further programmed to repress an output response according to a state of the aerial device.

19. The non-transitory computer-readable storage medium of claim 14, wherein the input signal is amplified via a differential voltage amplifier.

20. The non-transitory computer-readable storage medium of claim 14, wherein the feedback wire is a first feedback wire of a plurality of feedback wires, wherein each feedback wire of the plurality of feedback wires is associated with a respective electrical bonding cable of the plurality of electrical bonding cables and carries a respective input signal from the respective electrical bonding cable to the at least one microprocessor.

* * * * *